United States Patent
Kim et al.

(10) Patent No.: US 10,923,510 B2
(45) Date of Patent: Feb. 16, 2021

(54) DISPLAY DEVICE AND MANUFACTURING METHOD THEREOF

(71) Applicant: Samsung Display Co., Ltd., Yongin-si (KR)

(72) Inventors: Yang Hee Kim, Yongin-si (KR); Won Ho Kim, Yongin-si (KR); Jeong Ho Lee, Yongin-si (KR); So Yeon Park, Yongin-si (KR); Hyung Chul Lim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/181,561

(22) Filed: Nov. 6, 2018

(65) Prior Publication Data

US 2019/0305010 A1 Oct. 3, 2019

(30) Foreign Application Priority Data

Mar. 27, 2018 (KR) ........................ 10-2018-0035277

(51) Int. Cl.
*H01L 27/12* (2006.01)
(52) U.S. Cl.
CPC ...... *H01L 27/1244* (2013.01); *H01L 27/1214* (2013.01); *H01L 27/1262* (2013.01)
(58) Field of Classification Search
CPC ............... H01L 27/1214; H01L 27/329; H01L 27/3279; H01L 27/3297
See application file for complete search history.

(56) References Cited

U.S. PATENT DOCUMENTS

| | | | |
|---|---|---|---|
| 9,559,128 B2 | 1/2017 | Kim et al. | |
| 9,929,226 B2 | 3/2018 | Im et al. | |
| 2005/0122462 A1* | 6/2005 | Park | G02F 1/13452 349/149 |
| 2011/0248262 A1* | 10/2011 | Kang | G02F 1/1333 257/43 |
| 2015/0243723 A1* | 8/2015 | Cho | H01L 27/124 257/43 |
| 2017/0185181 A1* | 6/2017 | Kim | G02F 1/1345 |
| 2019/0012031 A1* | 1/2019 | Kim | H01L 27/322 |

FOREIGN PATENT DOCUMENTS

KR  10-2016-0082804 A  7/2016

* cited by examiner

*Primary Examiner* — Grant S Withers
(74) *Attorney, Agent, or Firm* — Kile Park Reed & Houtteman PLLC

(57) ABSTRACT

A display device includes a substrate including a display area and a non-display area outside the display area, a plurality of pixels located in the display area, a driving circuit driving the pixels, and a pad portion located in the non-display area and electrically connected to the driving circuit through a plurality of outer wirings. The pad portion includes a plurality of pad wirings each electrically connected to corresponding ones of the outer wirings. The pad wirings includes a first pad wiring and a second pad wiring separated from each other. The first pad wiring includes a first electrode layer, an insulating layer on the first electrode, and a second electrode layer on the insulating layer in a stacking direction, the second electrode layer being connected to the first electrode layer. The second pad wiring includes the first electrode layer but not the second electrode layer.

16 Claims, 7 Drawing Sheets

DISPLAY DEVICE AND MANUFACTURING METHOD THEREOF

CROSS REFERENCE TO RELATED APPLICATION

Korean Patent Application No. 10-2018-0035277, filed on Mar. 27, 2018 in the Korean Intellectual Property Office (KIPO), and entitled: "Display Device and Manufacturing Method Thereof," is incorporated by reference herein in its entirety.

BACKGROUND

1. Field

Example embodiments relate to display devices and manufacturing methods thereof.

2. Discussion of the Related Art

With the development of information technology, the importance of display devices, which are a connection medium between users and information, has been emphasized. Accordingly, the use of display devices such as a liquid crystal display device and an organic light emitting display device is increasing.

Such a display device includes a substrate including a display area and a non-display area, pixels provided in the display region, a driving circuit portion provided in the non-display region, and a pad portion. The pad unit receives a control signal and a power source from the outside and transmits the signals to the pixels and the driving circuit unit.

SUMMARY

Embodiments are directed to a display device including a substrate including a display area and a non-display area outside the display area, a plurality of pixels located in the display area, a driving circuit driving the pixels, and a pad portion located in the non-display area and electrically connected to the driving circuit through a plurality of outer wirings. The pad portion includes a plurality of pad wirings each electrically connected to corresponding ones of the outer wirings. The pad wirings includes a first pad wiring and a second pad wiring separated from each other. The first pad wiring includes a first electrode layer, an insulating layer on the first electrode, and a second electrode layer on the insulating layer in a stacking direction, the second electrode layer being connected to the first electrode layer. The second pad wiring includes the first electrode layer. The second electrode layer is absent from the second pad wiring.

Each of the pad wirings includes a first area in which the outer wirings and the first electrode layer are electrically connected, and a second area adjacent to the first area.

The display device may further include an inorganic layer on the outer wirings. The inorganic layer may include a first contact hole exposing a portion of the each of the outer wirings in the first area.

The display device may further include an organic layer between the inorganic layer and the first electrode layer in the second area.

The first electrode layer may be on the inorganic layer and the organic layer and may be electrically connected to the outer wirings through the first contact hole.

The display device may further include a passivation layer on the first electrode layer.

The passivation layer may be absent in at least a portion of the second area of the first pad wiring so as to not overlap in the stacking direction with the second electrode layer.

The insulating layer may include a second contact hole exposing a portion of the first electrode layer in the second area of the first pad wiring.

The second electrode layer may be in the second area of the first pad wiring.

The first electrode layer of the first pad wiring and the first electrode layer of the second pad wiring may be on a same layer and include a same material.

The first electrode layer of the first pad wiring and the first electrode layer of the second pad wiring may be on the same layer and include a same material as a source electrode or a drain electrode of a transistor included in the pixels.

The driving circuit may include a scan driver to supply a scan signal to the pixels and an emission driver to supply an emission control signal to the pixels.

The second pad wiring may receive an emission start signal or a constant voltage from an external source.

Embodiments are also directed to a manufacturing method of a display device including a pad portion having a first pad wiring and a second pad wiring separated from each other. The method includes forming a first electrode layer in an area corresponding to the first pad wiring and the second pad wiring on a substrate, forming an insulating layer on the first electrode layer and providing a second electrode layer on the insulating layer only on an area corresponding to the first pad wiring of the first and second pad wirings.

The method may further include forming an inorganic layer on the outer wiring and forming an organic layer on the inorganic layer.

Forming the inorganic layer may include forming a first contact hole exposing a portion of the outer wiring. The first electrode layer may be provided on the inorganic layer and the organic layer and may be electrically connected to the outer wiring through the first contact hole.

Providing the second electrode layer may include forming the second electrode layer on the insulating layer by removing a portion of the second electrode layer corresponding to the second pad wiring.

The method may further include forming a passivation layer on the first electrode.

Forming the passivation layer may include removing a portion of the passivation layer such that the passivation layer does not overlap in the stacking direction with the second electrode layer.

Forming the insulating layer may include forming a second contact hole exposing a portion of the first electrode layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
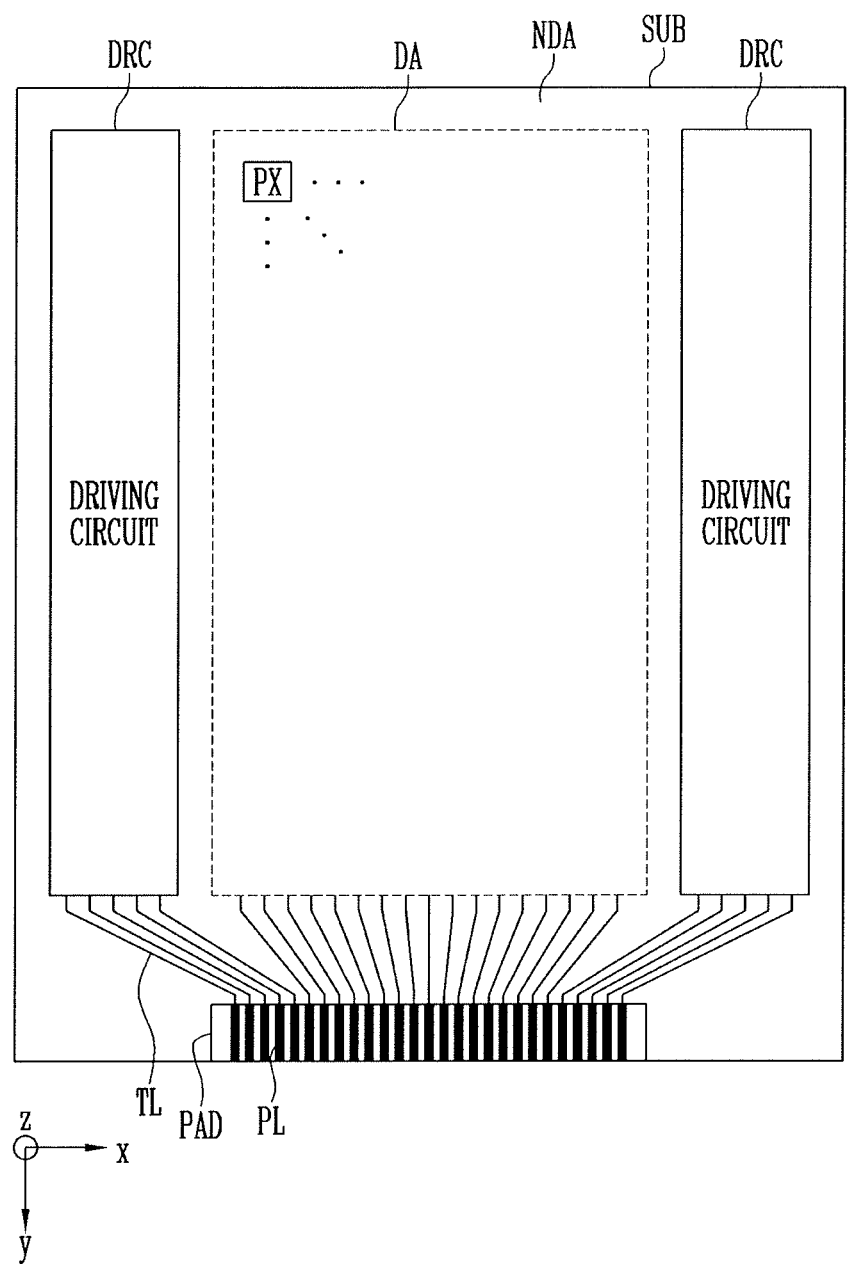
FIG. 1 illustrates a schematic plan view of a display device according to example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 illustrates a schematic plan view of a display device according to example embodiments. Referring to FIG. 1, the display device may include a substrate SUB, a plurality of pixels PX, a driving circuit DRC, and a pad portion PAD. The substrate SUB may include a display area DA and a non-display area NDA provided on at least one side of the display area DA.

The display area DA may be an area where the pixels PX are provided to display an image. The display area DA may be provided in a shape corresponding to a shape of the substrate SUB.

For example, the display area DA may be a closed polygon including sides of a straight line, a circle including curved lines, an ellipse, a semi-elliptical, semi-circular, and so on as well as the shape of the substrate SUB.

The pixels PX may be provided on the display area DA of the substrate SUB. The pixels PX may be provided in plurality as a minimum unit for displaying the image. The pixels PX may emit white light and/or color light. Each of the pixels PX may emit any one of red, green, and blue light, as examples. The pixels PX may emit colored light such as cyan, magenta, and yellow colors.

The pixels PX may be organic light emitting diodes including an organic layer, as examples. The pixels PX may be implemented in various forms such as a liquid crystal element, an electrophoretic element, and an electrowetting element. The pixels PX may be arranged in various forms. For example, the pixels PX may be arranged in a matrix form. The non-display area NDA may be an area in which the pixels PX are not provided and where no image is displayed. The size and shape of the non-display area NDA may be variously modified. For example, the non-display area NDA may be a window frame shape surrounding the display area DA.

The driving circuit DRC may be electrically connected to the pixels PX to drive the pixels PX. The driving circuit DRC may be located in the non-display area NDA. The driving circuit DRC may be provided on both sides of the substrate SUB or only on one side of the substrate SUB. The driving circuit DRC may include at least one of a scan driver to supply a scan signal to the pixels PX and an emission driver to supply an emission control signal to the pixels PX.

In some implementations, the driver circuit DRC may be mounted directly on the substrate SUB. In addition, the driving circuit DRC may be formed together at the time of forming the pixels PX. In some implementations, the driving circuit DRC may be provided on a separate chip and may be on the substrate SUB in a chip on glass form, or may be mounted on a separate printed circuit board and connected to the substrate SUB through a connection member.

The pad portion PAD may be located in the non-display area NDA. The pad portion PAD may be electrically connected to the driving circuit DRC through outer wirings TL. The pad portion PAD may be located at a lower end area of the substrate SUB. If the substrate SUB is a flexible substrate, all or a part of the pad portion PAD may be bent.

The pad portion PAD may include a plurality of pad wirings PL each electrically connected to respective ones of the outer wirings TL. The pad wirings PL may correspond one-to-one to the outer wirings TL. The pad wirings PL may be mutually separated patterns, for example along an x-axis direction.

The outer wirings TL may be located in the non-display area NDA. The outer wirings TL may extend along one side of the substrate SUB or may be bent a plurality of times. The outer wirings TL may include various signal lines connected to the driving circuit DRC, power supply lines, and data lines connected to the pixels PX.

Figure 2:
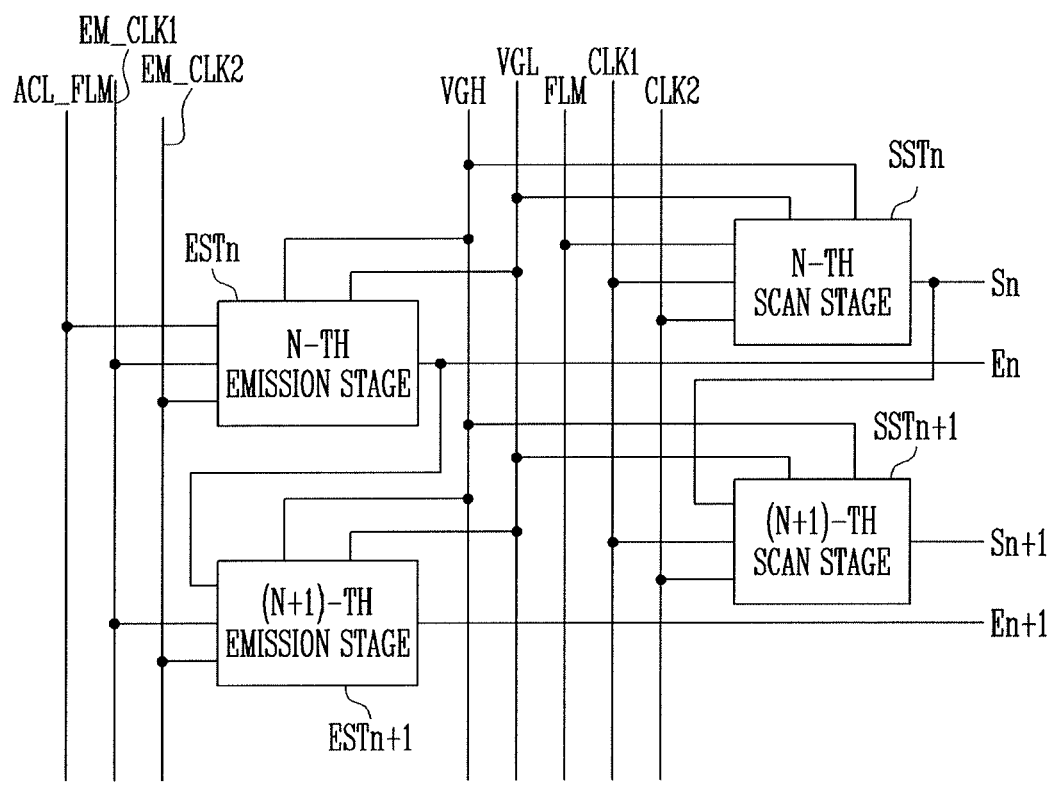
FIG. 2 illustrates a diagram showing an example of a driving circuit in the display device of FIG. 1.

FIG. 2 illustrates a diagram illustrating an example of a driving circuit in the display device of FIG. 1. In FIG. 2, for convenience of explanation, a part of a scan driver connected to an n-th scan line Sn and an (n+1)-th scan line Sn+1, and an emission driver connected to an n-th emission control line En and an (n+1)-th emission control line En+1 are illustrated. The n-th scan line Sn and the n-th emission control line En may be connected to pixels PX arranged in an n-th pixel row and the (n+1)-th scan line Sn+1 and the (n+1)-th emission control line En+1 may be connected to pixels PX arranged in an (n+1)-th pixel row.

Referring to FIG. 2, the driving circuit DRC may have various structures. For example, according to example embodiments, the driving circuit DRC may include the scan driver including a plurality of scan stages SSTn and SSTn+1 and the emission driver including a plurality of emission stages ESTn and ESTn+1. The scan stages SSTn and SSTn+1 and the emission stages ESTn and ESTn+1 may be connected to the outer wirings TL to receive a power supply voltage, a start signal, and a clock signal. The outer wirings TL may include a first power supply line VGH, a second power supply line VGL, a scan start signal line FLM, a first clock signal line CLK1, a second clock signal line CLK2, a first emission clock signal line EM_CLK1, and a second emission clock signal line EM_CLK2.

The n-th scan stage SSTn may be connected to the first power supply line VGH to receive a first power supply voltage and may be connected to the second power supply line VGL to receive a second power supply voltage. The first power supply voltage may be set to a gate high voltage, and the second power supply voltage may be set to a gate low voltage. The n-th scan stage SSTn may be connected to the scan start signal line FLM to receive a scan start signal. The n-th scan stage SSTn may be connected to the first clock signal line CLK1 to receive a first clock signal. The n-th scan stage SSTn may be connected to the second clock signal line CLK2 to receive a second clock signal. The first clock signal and the second clock signal may be set to have opposite phases. The n-th scan stage SSTn may output the scan signal to the n-th scan line Sn in response to the scan start signal and the first and second clock signals.

The (n+1)-th scan stage SSTn+1 may be connected to the first power supply line VGH, the second power supply line VGL, the first clock signal line CLK1 and the second clock signal line CLK2. The (n+1)-th scan stage SSTn+1 may output the scan signal to the (n+1)-th scan line Sn+1 in response to the scan signal supplied from the n-th scan stage SSTn and the first and second clock signals.

The n-th emission stage ESTn may be connected to the first power supply line VGH to receive the first power supply voltage and may be connected to the second power supply line VGL to receive the second power supply voltage. The n-th emission stage ESTn may be connected to the emission start signal line ACL_FLM to receive the emission start signal. The n-th emission stage ESTn may be connected to the first emission clock signal line EM_CLK1 to receive the first emission clock signal and may be connected to the second emission clock signal line EM_CLK2 to receive the second emission clock signal. The n-th emission stage ESTn may output the emission control signal to the n-th emission control line En in response to the emission start signal and the first and second emission clock signals.

The (n+1)-th emission stage ESTn+1 may be connected to the first power supply line VGH, the second power supply line VGL, the first emission clock signal line EM_CLK1 and the second emission clock signal line EM_CLK2. The (n+1)-th emission stage ESTn+1 may output the emission control signal to the (n+1)-th emission control line En+1 in response to the emission control signal provided from the n-th emission stage ESTn and the first and second emission clock signals.

Figure 3:
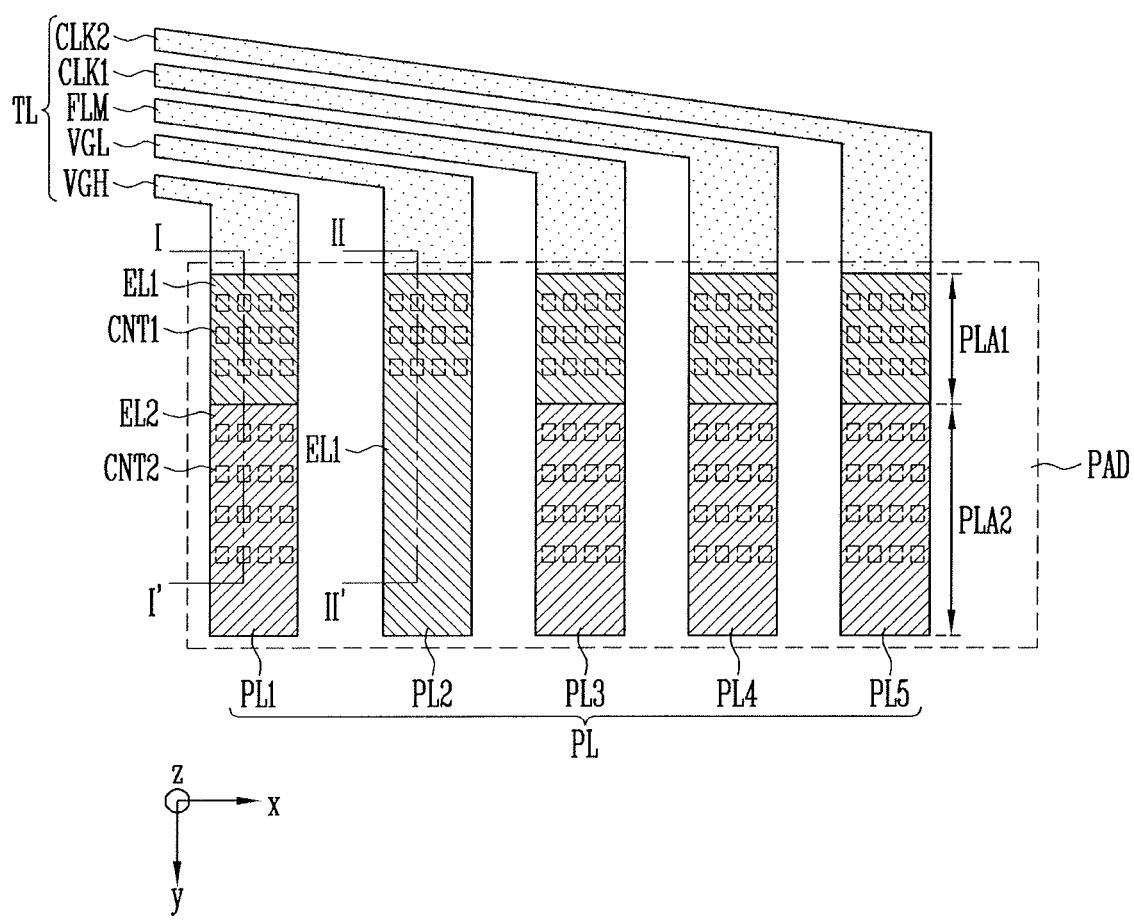
FIG. 3 illustrates a partially enlarged plan view illustrating an example of a pad portion.
Figure 4A:
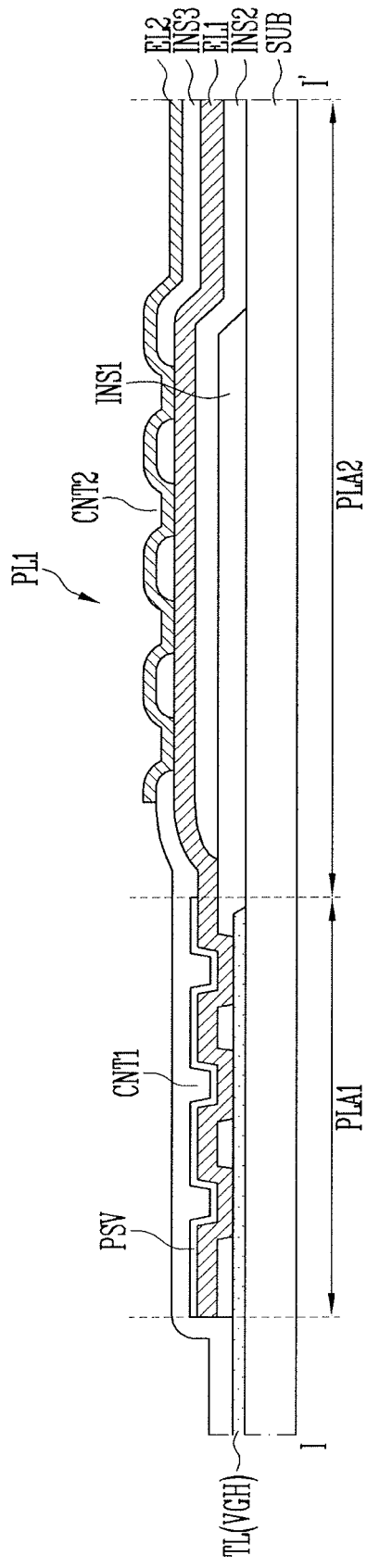
FIG. 4A illustrates a cross-sectional view taken along a line I-I' of FIG. 3.
Figure 4B:
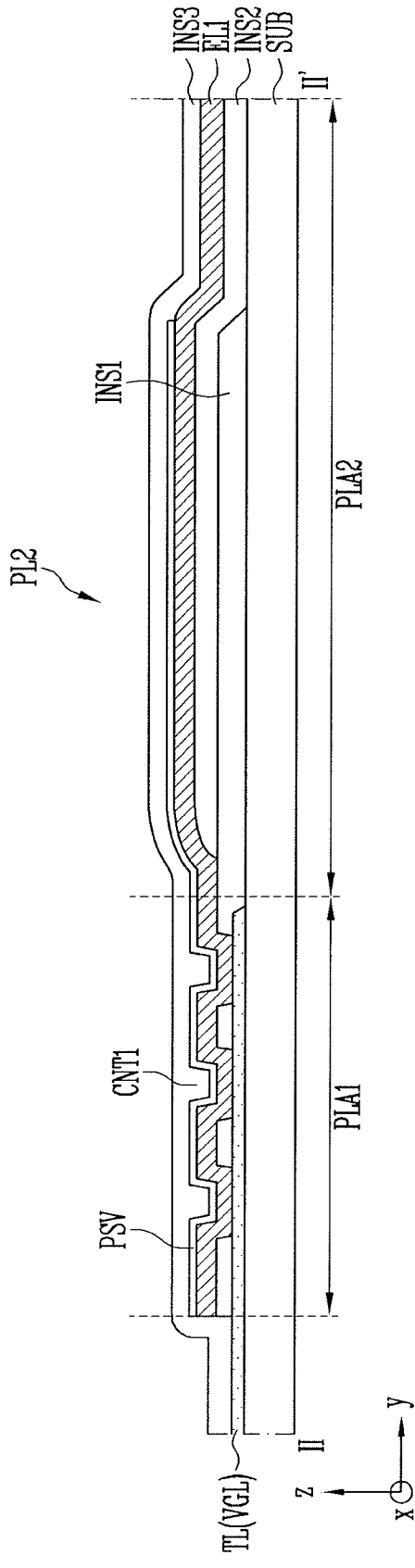
FIG. 4B is a cross-sectional view taken along a line II-II' of FIG. 3.

FIG. 3 illustrates a partially enlarged plan view of an example of a pad portion. FIG. 4A illustrates a cross-sectional view taken along a line I-I' of FIG. 3, and FIG. 4B illustrates a cross-sectional view taken along a line II-II' of FIG. 3.

In FIG. 3, for convenience of explanation, a portion of the outer wirings TL and a portion of the pad wirings PL are shown. Referring to FIG. 3, the outer wirings TL may include the first power supply line VGH, the second power supply line VGL, the scan start signal line FLM, the first clock signal line CLK1, and the second clock signal line CLK2.

In some embodiments, the outer wirings TL may be provided on a same layer be made of a same material as gate electrodes of transistors included in the pixels PX. For example, the outer wirings TL may be formed of a low resistance metal material such as molybdenum (Mo), silver (Ag), titanium (Ti), copper (Cu), aluminum (Al). The outer wirings TL may be a single layer or a multi-layer. When the outer wirings Tl are a multi-layer, the multi-layer may include two or more of the metal materials stacked.

The pad wirings PL may include first to fifth pad wirings PL1 to PL5 corresponding to the outer wirings TL, respectively, and that are spaced apart along the x-axis direction and that extend in a y-axis direction. For example, the first pad wiring PL1 may be connected to the first power supply line VGH, the second pad wiring PL2 may be connected to the second power supply line VGL, the third pad wiring may be connected to the scan start signal line FLM, the fourth pad wiring PL4 may be connected to the first clock signal line CLK1, and the fifth pad wiring PL5 may be connected to the second clock signal line CLK2.

Each of the pad wirings PL may include a first area PLA1 overlapping in the stacking direction (z-axis direction) with respective ones of the outer wirings TL and a second area PLA2 adjacent to the first area PLA1. For example, in the stacking direction, an end of the first power supply line VGH may overlap the first area PLA1 of the first pad wiring PL1, and an end of the second power supply line VGL may overlap the first area PLA1 of the second pad wiring PL2.

The first pad wiring PL1, the third pad wiring PL3, the fourth pad wiring and the fifth pad wiring PL5 may have substantially the same structure. The second pad wiring PL2 may have a structure that is different from the first pad wiring PL1. Hereinafter, the first pad wiring PL1 and the second pad wiring PL2 will be described.

The second pad wiring PL2 may be a wiring to which a voltage greater than a reference value is applied. In some embodiments, the second pad wiring PL2 may provide a second power supply of constant voltage provided from the outside to the driving circuit DRC through the second power supply line VGL. In some embodiments, the second pad wiring PL2 may receive an emission start signal from outside and provide the emission start signal to the driving circuit DRC through the light emission start signal line ACL_FLM.

Referring to FIGS. 4A and 4B, the first pad wiring PL1, as illustrated in FIG. 4A, and the second pad wiring PL2, as illustrated in FIG. 4B, may commonly include an inorganic layer INS1, an organic layer INS2, and a passivation layer PSV. Further, the first pad wiring PL1 may include a first electrode layer EL1, an insulating layer INS3, and a second electrode layer EL2. The second pad wiring PL2 may include the first electrode layer EL1 but not the second electrode layer EL2. For example, the first pad wiring PL1 may have a double electrode layer structure and the second pad wiring PL2 may have a single electrode layer structure.

The substrate SUB may be made of an insulating material such as glass, resin, or the like. Further, the substrate SUB may be made of a material having flexibility to be bent or folded. The substrate SUB may have a single-layer structure or a multi-layer structure. For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose triacetate cellulose, and cellulose acetate propionate. In some implementations, the material constituting the substrate SUB may be fiber reinforced plastic (FRP) or the like.

The inorganic layer INS1 may be provided on the outer wiring TL. The inorganic layer INS1 may include a first contact hole CNT1 that exposes a portion of the outer wiring TL in the first area PLA1. When the pad portion PAD is located in a bending area, the inorganic layer INS1 may be partially removed from the second area PLA2. The inorganic layer INS1 may include an inorganic insulating material such as polysiloxane, silicon nitride, silicon oxide, silicon oxynitride or the like.

The organic layer INS2 may be provided on the inorganic layer INS1. The organic layer INS2 may be removed or absent in the first area PLA1. For example, the organic layer INS2 may be provided only in the second area PLA2. The organic layer INS2 may be provided to not overlap with the outer wiring TL in the stacking direction. The organic layer INS2 may include an organic insulating material such as a polyacrylic compound, a polyimide compound, a fluorocarbon compound such as Teflon, a benzocyclobutene compound, or the like.

The first electrode layer EL1 may be provided on the inorganic layer INS1 and the organic layer INS2 and may be electrically connected to the outer wiring TL through the first contact hole CNT1. The first electrode layer EL1 may be included in each of the pad wirings PL in a pattern separated from each other. Herein, the first electrode layer EL1 included in the first pad wiring PL1 will be referred to as the first electrode layer EL1 of the first pad wiring PL1, and the first electrode layer EL1 included in the second pad wiring PL2 will be referred to as a first electrode layer EL1 of the second pad wiring PL2. The first electrode layer EL1 of the first pad wiring PL1 may be connected to the first power supply line VGH in the first area PLA1. The first electrode layer EL1 of the second pad wiring PL2 may be connected to the second power supply line VGL in the first area PLA1.

The first electrode layer EL1 of the first pad wiring PL1 and the first electrode layer EL1 of the second pad wiring PL2 may be provided on the same layer and may include the same material. The first electrode layer EL1 may be provided on the same layer with the same material as a source electrode or a drain electrode of a transistor included in each of the pixels PX. For example, the first electrode EL1 may include at least one of gold (Au), silver (Ag), aluminum (Al), molybdenum (Mo), chromium (Cr), titanium (Ti), nickel (Ni), neodymium (Nd), copper (Cu), or an alloy of these metals. The first electrode layer EL1 may be formed as a single layer. In some implementations, the first electrode layer EL1 may be formed as a multilayer in which two or more of the metals and the alloys are stacked.

A passivation layer PSV may be provided on the first electrode layer EL1. The passivation layer PSV may be partially removed in, or absent from the second area PLA2 of the first pad wiring PL1, so as not to overlap the second electrode layer EL2 in the stacking direction in the second area PLA2 of the first pad wiring PL1. The passivation layer PSV may be formed in the first area PLA1 and the second area PLA2 of the second pad wiring PL2. The passivation layer PSV may be an inorganic insulating layer made of an inorganic material. As the inorganic material, polysiloxane, silicon nitride, silicon oxide, silicon oxynitride and the like may be used.

The insulating layer INS3 may be provided on the first electrode layer EL1 and the passivation layer PSV. The insulating layer INS3 may be provided to cover the outer wiring TL, the first electrode layer EL1, and the passivation layer PSV. In the second area PLA2 of the first pad wiring PL1, the insulating layer INS3 may include a second contact hole CNT2 exposing a portion of the first electrode layer EL1.

The insulating layer INS3 may be an organic insulating layer made of the organic material. As the organic material, an organic insulating material such as a polyacrylic compound, a polyimide compound, a fluorocarbon compound such as Teflon, a benzocyclobutene compound, or the like may be used.

The second electrode layer EL2 may be provided on the insulating layer INS3 in the second area PLA2 of the first pad wiring PL1. The second electrode layer EL2 may be provided only in the second area PLA2 of the first pad wiring PL1. For example, the second electrode layer EL2 may be removed or absent from the first area PLA1 of the first pad wiring PL1 and from the first and second areas PLA1 and PLA2 of the second pad wiring PL2. The second electrode layer EL2 may be electrically connected to the first electrode layer EL1 of the first pad wiring PL1 through the second contact hole CNT2. The second electrode layer EL2 may be made of the same material as the first electrode layer EL1.

The first pad wiring PL1 may help to prevent cracking that could occur from bending and may reduce wiring resistance due to the double electrode layer structure of the first electrode layer EL1 and the second electrode layer EL2. The second pad wiring PL2, on the other hand, may have a single electrode layer structure including the first electrode layer EL1 from which the second electrode layer EL2 is absent or removed. Thus, in the second pad wiring PL2 corrosion that could occur in a contact portion by the contact between the two electrode layers (e.g., the first electrode layer and the second electrode layer) may be prevented.

FIGS. 5 to 11B illustrate cross-sectional views of a manufacturing method of a display device according to example embodiments. Elements having the same reference numerals as those of the above-described elements refer to the above-described disclosure, and duplicate descriptions will not be omitted. FIGS. 5 to 8 illustrate common manufacturing methods applied to the first pad wiring PL1 and the second pad wiring PL2.

Figure 5:
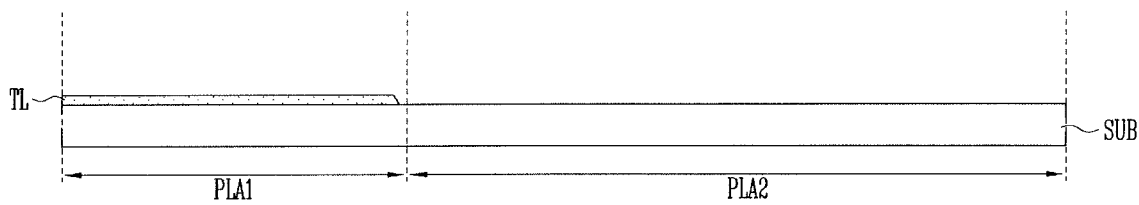
FIGS. 5 to 11B illustrate cross-sectional views of a manufacturing method of a display device according to example embodiments.

Referring to FIG. 5, outer wirings TL may be formed on the substrate SUB. The outer wirings TL may be formed up to the first area PLA1 of the pad wirings PL and may be absent or removed in the second area PLA2. The outer wirings TL may be formed by depositing a material of the outer wirings TL on the substrate SUB and patterning the material. A photolithography process and an etching process may be performed for patterning the outer wiring lines TL.

Figure 6:
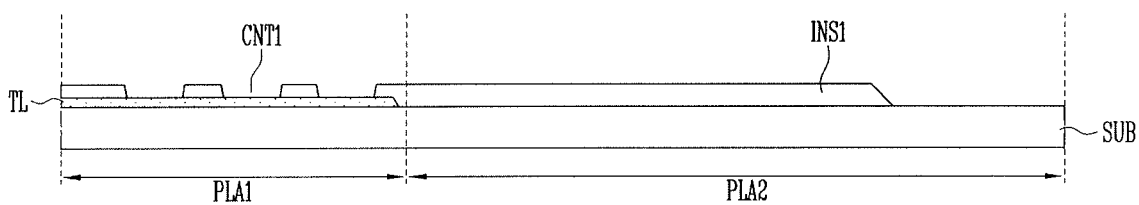

Referring to FIG. 6, the inorganic layer INS1 may be formed on the outer wirings TL and the substrate SUB. The first contact hole CNT1 exposing a portion of the outer wirings TL in the first area PLA1 of the inorganic layer INS1 may be formed. The inorganic layer INS1 may include an inorganic insulating material such as polysiloxane, silicon nitride, silicon oxide, silicon oxynitride, or the like.

Figure 7:
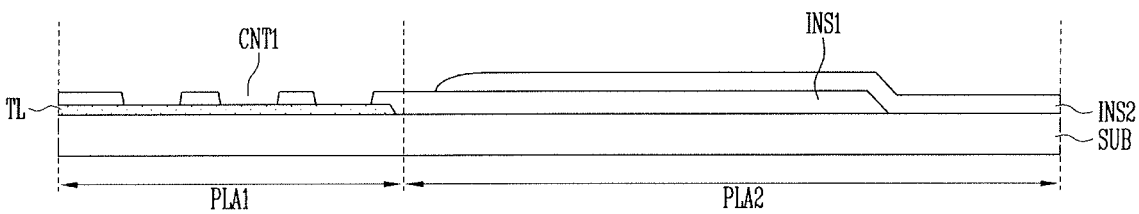

Referring to FIG. 7, the organic layer INS2 may be formed on the inorganic layer INS1 and the substrate SUB. The organic layer INS2 may be formed only in the second area PLA2 and may be absent or removed in the first area PLA1. The organic layer INS2 may include an organic insulating material such as a polyacrylic compound, a polyimide compound, a fluorocarbon compound such as Teflon®, a benzocyclobutene compound, or the like.

Figure 8:
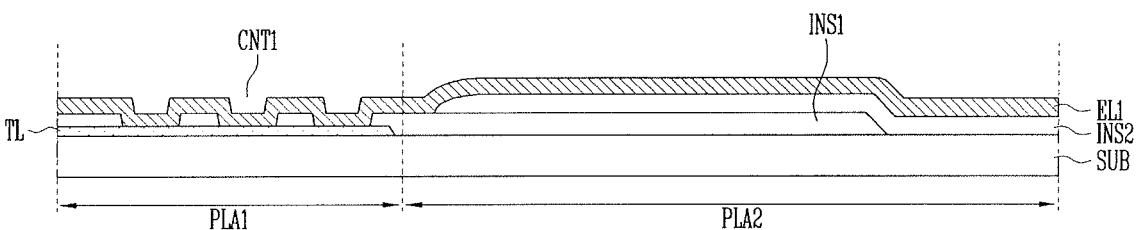

Referring to FIG. 8, the first electrode layer EL1 may be formed on the inorganic layer INS1 and the organic layer INS2. The first electrode layer EL1 may be electrically connected to the outer wirings TL through the first contact hole CNT1 in the first area PLA1. The first electrode layer EL1 may be formed by depositing a material of the first electrode layer EL1 and patterning the material. The patterning of the first electrode layer EL1 may be performed by a photolithography process and an etching process.

In some embodiments, the first electrode layer EL1 may be provided on the same layer and include the same material as the source electrode or the drain electrode of the transistor included in the pixels PX. For example, the first electrode layer EL1 may include at least one of gold (Au), silver (Ag), aluminum (Al), molybdenum (Mo), chromium (Cr), titanium (Ti), nickel (Ni), neodymium (Nd), copper (Cu), or an alloy of these metals. The first electrode layer EL1 may be formed of a single layer. In some implementations, the first electrode layer EL1 may be formed as a multilayer in which two or more of the metals and the alloys are stacked.

Figure 9A:
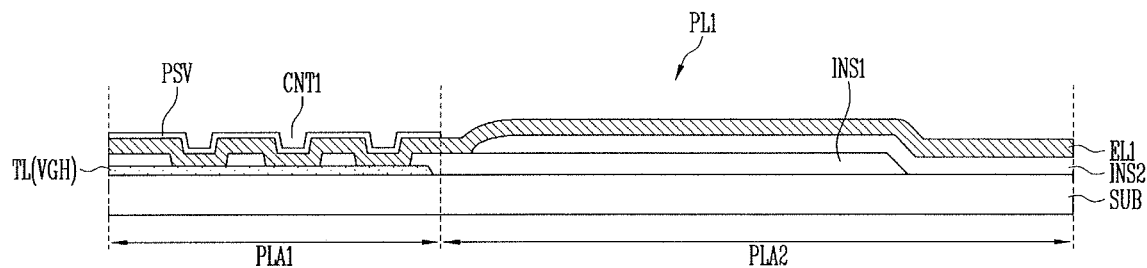
Figure 9B:
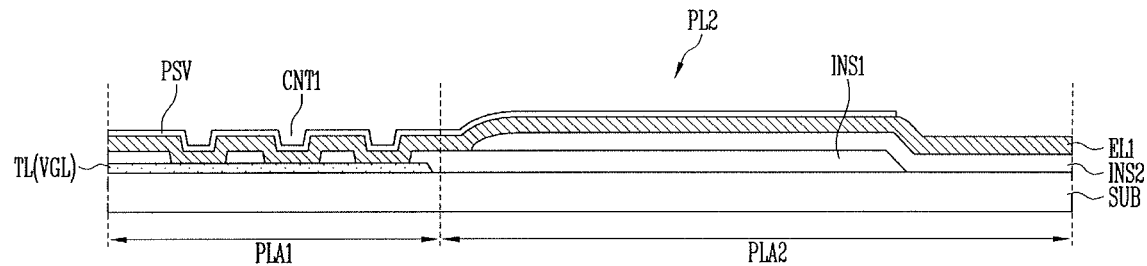

Referring to FIGS. 9A and 9B, the passivation layer PSV may be formed on the first electrode layer EL1. The passivation layer PSV may be partially removed from, or not formed in, the second area PLA2 of the first pad wiring PL1, such that the passivation layer PSV does not overlap the second electrode layer EL2 in the stacking direction in the second area PLA2 of the first pad wiring PL1. The passivation layer PSV may be an inorganic insulating layer made of an inorganic material. The inorganic material may include polysiloxane, silicon nitride, silicon oxide, silicon oxynitride, or the like.

Figure 10A:
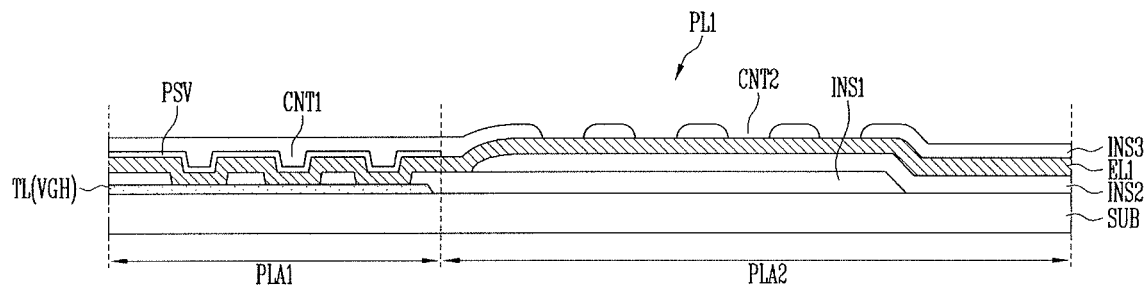
Figure 10B:
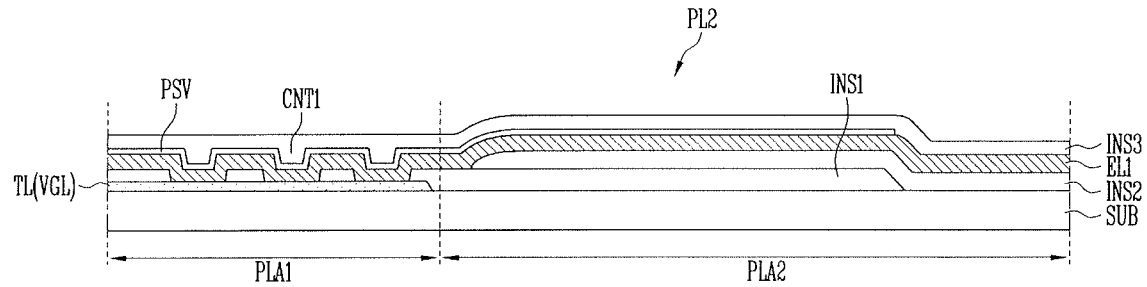

Referring to FIGS. 10A and 10B, the insulating layer INS3 may be formed on the first electrode layer EL1 and the passivation layer PSV. The second contact hole CNT2 exposing a portion of the first electrode layer EL1 in the second area PLA2 of the first pad wiring PL1 may be formed. The second contact hole CNT2 is not formed on the second pad wiring PL2. The insulating layer INS3 may be an organic insulating layer made of an organic material. The organic material may be an organic insulating material such as a polyacrylic compound, a polyimide compound, a fluorocarbon compound such as Teflon, a benzocyclobutene compound, or the like.

Figure 11A:
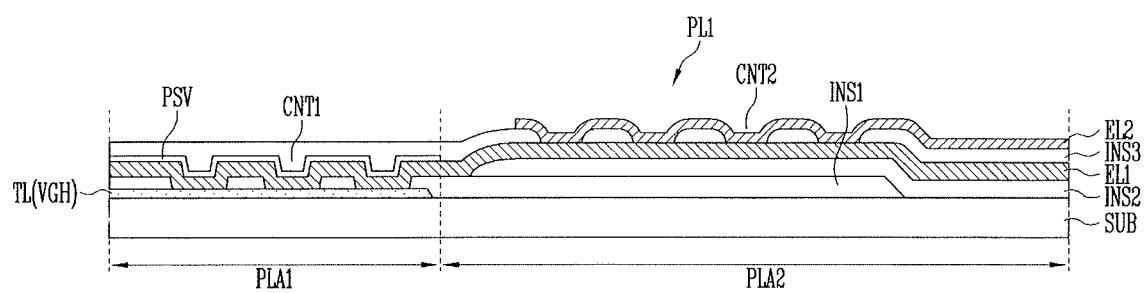
Figure 11B:
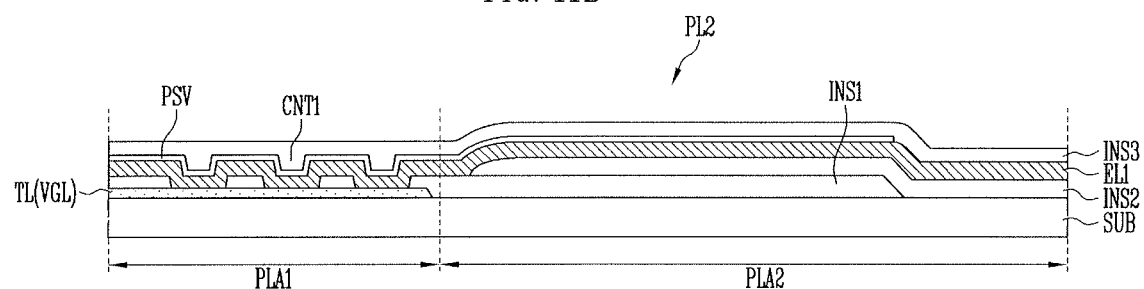

Referring to FIGS. 11A and 11B, the second electrode layer EL2 may be formed on the insulating layer INS3. The second electrode layer EL2 may be removed from, or may be not be formed in, the first area PLA1 of the first pad wiring PL1 and the first and second areas PLA1 and PLA2 of the second pad wiring PL2. The second electrode layer EL2 may be electrically connected to the first electrode layer EL1 of the first pad wiring PL1 through the second contact hole CNT2. The second electrode layer EL2 may be made of the same material as the first electrode layer EL1.

In the first pad wiring PL1 cracking that could occur during bending may be prevented and wiring resistance may be reduced due to the double electrode layer structure of the first electrode layer EL1 and the second electrode layer EL2. The second pad wiring PL2 may have a single electrode layer structure of the first electrode layer EL1 and not including a second electrode layer EL2. Thus, corrosion that could occur in the contact portion of two electrode layers (e.g., the first and second electrode layers) may be avoided in the second pad wiring PL2 having a single layer structure.

By way of summation and review, in the display device and the manufacturing method thereof according to example embodiments, some pad wirings may have a double electrode layer structure to minimize cracking that could occur from bending and to reduce wiring resistance. Other pad wirings may have a single layer structure to avoid corrosion that could occur in a contact portion of double electrode layer structure. Accordingly, embodiments provide a display device in which defects in the pad portion PAD may be prevented, and a manufacturing method thereof.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof the present invention as set forth in the following claims.

What is claimed is:

1. A display device, comprising:
   a substrate including a display area and a non-display area outside the display area;
   a plurality of pixels located in the display area;
   a driving circuit driving the pixels; and
   a pad portion located in the non-display area and electrically connected to the driving circuit through a plurality of outer wirings, wherein:
   the pad portion includes a plurality of pad wiring structures on the outer wirings, the pad wiring structures being each electrically connected to corresponding ones of the outer wirings,
   the pad wiring structures include a first pad wiring structure and a second pad wiring structure separated from each other,
   the first pad wiring structure includes a first electrode layer, an insulating layer on the first electrode layer, and a second electrode layer on the insulating layer in a stacking direction, the second electrode layer being connected to the first electrode layer, wherein
   each of the pad wiring structures includes a first area in which the outer wirings and the first electrode layer are electrically connected, and a second area adjacent to the first area,
   the second pad wiring structure includes the first electrode layer,
   the second electrode layer is absent from the second pad wiring structure, and
   an inorganic layer is on the outer wirings and includes a first contact hole exposing a portion of the each of the outer wirings in the first area.

2. The display device as claimed in claim 1, further comprising:
   an organic layer between the inorganic layer and the first electrode layer in the second area.

3. The display device as claimed in claim 2, wherein the first electrode layer is on the inorganic layer and the organic layer and electrically connected to the outer wirings through the first contact hole.

4. The display device as claimed in claim 3, further comprising:
   a passivation layer on the first electrode layer.

5. The display device as claimed in claim 4, wherein the passivation layer is absent in at least a portion included in the second area of the first pad wiring structure so as to not overlap in the stacking direction with the second electrode layer.

6. The display device as claimed in claim 1, wherein the insulating layer includes a second contact hole exposing a portion of the first electrode layer in the second area included in the first pad wiring structure.

7. The display device as claimed in claim 6, wherein the second electrode layer is in the second area included in the first pad wiring structure.

8. The display device as claimed in claim 1, wherein the first electrode layer of the first pad wiring structure and the first electrode layer of the second pad wiring structure are on a same layer and include a same material.

9. The display device as claimed in claim 8, wherein the first electrode layer of the first pad wiring structure and the first electrode layer of the second pad wiring structure are on a same layer and include a same material as a source electrode or a drain electrode of a transistor included in the pixels.

10. The display device as claimed in claim 1, wherein the driving circuit includes:
   a scan driver to supply a scan signal to the pixels; and
   an emission driver to supply an emission control signal to the pixels.

11. The display device as claimed in claim 1, wherein the second pad wiring structure receives an emission start signal or a constant voltage from an external source.

12. A method of manufacturing a display device including a pad portion having a first pad wiring structure and a second pad wiring structure separated from each other, the method comprising:
   forming an outer wiring;
   forming an inorganic layer on the outer wiring;
   forming a first electrode layer in an area corresponding to the first pad wiring structure and in an area corresponding to the second pad wiring structure on the inorganic layer, the first electrode layer being electrically connected to the outer wiring;
   forming an insulating layer on the first electrode layer;
   providing a second electrode layer on the insulating layer only on an area corresponding to the first pad wiring structure of the first and second pad wiring structures; and
   forming an organic layer on the inorganic layer, wherein forming the inorganic layer includes:
      forming a first contact hole exposing a portion of the outer wiring, and
      providing the first electrode layer on the inorganic layer and the organic layer to be electrically connected to the outer wiring through the first contact hole.

13. The method as claimed in claim 12, wherein providing the second electrode layer includes forming the second electrode layer on the insulating layer by removing a portion of the second electrode layer corresponding to the second pad wiring structure.

14. The method as claimed in claim 12, further comprising:
   forming a passivation layer on the first electrode layer.

15. The method as claimed in claim 14, wherein forming the passivation layer includes:
   removing a portion of the passivation layer such that the passivation layer does not overlap in a stacking direction with the second electrode layer in the area corresponding to the first pad wiring structure.

16. The method as claimed in claim 12, wherein forming the insulating layer includes:
   forming a second contact hole exposing a portion of the first electrode layer.

* * * * *